US007797117B1

(12) United States Patent
Gordin

(10) Patent No.: US 7,797,117 B1
(45) Date of Patent: Sep. 14, 2010

(54) METHOD AND SYSTEM FOR EARLY PREDICTION OF PERFORMANCE OF HID LAMPS

(75) Inventor: Myron K. Gordin, Oskaloosa, IA (US)

(73) Assignee: Musco Corporation, Oskaloosa, IA (US)

( * ) Notice: Subject to any disclaimer, the term of this patent is extended or adjusted under 35 U.S.C. 154(b) by 322 days.

(21) Appl. No.: 11/966,762

(22) Filed: Dec. 28, 2007

Related U.S. Application Data

(60) Provisional application No. 60/882,764, filed on Dec. 29, 2006.

(51) Int. Cl.
*G01N 37/00* (2006.01)
*G01R 31/00* (2006.01)

(52) U.S. Cl. ............................. 702/81; 324/414; 445/3

(58) Field of Classification Search ................ 324/430, 324/414; 702/81–84, 182; 445/3
See application file for complete search history.

(56) References Cited

U.S. PATENT DOCUMENTS

| | | | | |
|---|---|---|---|---|
| 3,249,859 | A * | 5/1966 | Speros et al. | 324/414 |
| 4,994,718 | A | 2/1991 | Gordin | |
| 5,202,636 | A * | 4/1993 | Powell | 324/414 |
| 5,229,681 | A | 7/1993 | Gordin et al. | |
| 5,856,721 | A | 1/1999 | Gordin et al. | |
| 6,538,448 | B1 * | 3/2003 | Tabell | 324/414 |
| 6,760,124 | B1 * | 7/2004 | Boerger et al. | 358/1.9 |
| 6,929,385 | B2 | 8/2005 | Gordin et al. | |
| 7,059,745 | B2 | 6/2006 | Gordin et al. | |
| 7,250,769 | B1 * | 7/2007 | Olson | 324/414 |
| 7,284,879 | B2 | 10/2007 | Gordin et al. | |
| 2004/0075874 | A1 * | 4/2004 | Boerger et al. | 358/475 |
| 2006/0175987 | A1 | 8/2006 | Gordin et al. | |
| 2006/0176700 | A1 | 8/2006 | Gordin et al. | |
| 2008/0103714 | A1 * | 5/2008 | Aldrich et al. | 702/81 |
| 2008/0218171 | A1 * | 9/2008 | Keith et al. | 324/414 |

* cited by examiner

*Primary Examiner*—Thuy Vinh Tran
(74) *Attorney, Agent, or Firm*—McKee, Voorhees & Sease, P.L.C.

(57) ABSTRACT

A method and system of classifying predicted performance of HID lamps or light sources. A characteristic of each lamp or light source is measured after a relatively short time of operation of the lamp or light source. The measurement is placed into one of a plurality of classifications based on its relative value to other similar measurements. Each class is correlated to long term predicted performance of the lamp or light source.

44 Claims, 9 Drawing Sheets

| TEST ID | TEST SET | AVG. LUMENS | MAX. LUMENS | MIN. LUMENS |
|---|---|---|---|---|
| 1 | 12 | 154429 | 159998 | 149855 |
| 2 | 16 | 157150 | 165030 | 151750 |
| 3 | 16 | 157893 | 166846 | 147275 |
| 4 | 16 | 159314 | 165583 | 154104 |
| 5 | 15 | 153972 | 161276 | 140764 |
| 6 | 15 | 150764 | 163295 | 143928 |
| 7 | 20 | 152495 | 166192 | 137377 |
| 8 | 18 | 155312 | 164382 | 134356 |
| 9 | 19 | 156864 | 167939 | 144728 |
| 10 | 18 | 149146 | 158346 | 138149 |
| 11 | 17 | 156619 | 165256 | 145545 |
| 12 | 18 | 154733 | 162292 | 141397 |
| 13 | 17 | 152004 | 161098 | 136938 |
| 14 | 16 | 153635 | 159821 | 148303 |
| 15 | 22 | 153942 | 160185 | 147059 |

| AVG. OF ALL TESTED LIGHT SOURCES | HIGHEST OF ALL TESTED LIGHT SOURCES | LOWEST OF ALL TESTED LIGHT SOURCES |
|---|---|---|
| 154552 | 167939 | 134356 |

MEASURED LIGHT OUTPUT FOR SELECTED OPERATING TIMES FOR EACH OF THE SET OF LAMPS T1–Ts

| TEST LAMP / OPERATING TIME → | 10 MIN | 20 MIN | 30 MIN | 40 MIN | 50 MIN | 1 HR |
|---|---|---|---|---|---|---|
| T1 | 199 lm x 1000 | 198 lm x 1000 | 197 lm x 1000 | 196 lm x 1000 | 196 lm x 1000 | 194 lm x 1000 |
| T2 | 185 lm x 1000 | 184 lm x 1000 | 183 lm x 1000 | 182 lm x 1000 | 181 lm x 1000 | 180 lm x 1000 |
| T3 | 178 lm x 1000 | 178 lm x 1000 | 177 lm x 1000 | 177 lm x 1000 | 176 lm x 1000 | 176 lm x 1000 |
| Ts | 168 lm x 1000 | 168 lm x 1000 | 167 lm x 1000 | 167 lm x 1000 | 166 lm x 1000 | 166 lm x 1000 |

112

| LAMP | STLO | RILO | ERROR | CLASS |
|---|---|---|---|---|
| N1 | 170 | 155 | +9.6% | HI PERFORM |
| N2 | 156 | 155 | +0.6% | AVG PERFORM |
| N3 | 153 | 155 | −1.3% | AVG PERFORM |
| Nm | 140 | 155 | −9.7% | LO PERFORM |

METHOD AND SYSTEM FOR EARLY PREDICTION OF PERFORMANCE OF HID LAMPS

CROSS-REFERENCE TO RELATED APPLICATIONS

This application claims priority under 35 U.S.C. §119 of a provisional U.S. application Ser. No. 60/882,764, filed Dec. 29, 2006, which application is hereby incorporated by reference in its entirety.

I. BACKGROUND OF THE INVENTION

A. Field of the Invention

The present invention relates to a method and system for predicting future performance by classifying individual lamps, in one example high-intensity discharge (HID) lamps, and using the classifications in designing lighting systems using such lamps.

B. Problems in the Art

There tends to be substantial lamp-to-lamp variability in light output (typically expressed as lumens), as well as other lamp performance characteristics, between HID lamps of the same type (e.g. metal halide, high-pressure sodium, or mercury vapor of certain rated operating power in watts) and specifications (e.g. chemicals, lamp operating position, and operating parameters like operating voltage and current), including from the same lamp manufacturer. Production techniques and/or inherent properties of HID lamps produce such variances. In the example of light output, testing has found there could be on the order of 25% variation of light output from these lamps. This creates a problem when designing lighting systems for wide area lighting such as sports lighting.

Such systems utilize a plurality of HID lamps and fixtures, each with a specific location and fixture angle or aiming orientation relative to a sports field to be illuminated. The goal is to position and aim these multiple fixtures in a manner to illuminate the field in a relatively even or uniform manner with sufficient intensity for the playability of the sport. It is also a typical goal that the system be designed to be as economical as possible. For example, a usual goal is to minimize the capital costs (e.g. number and cost of lighting fixtures, lamps, poles or elevating structure, and ancillary equipment). It can also be a goal to minimize operating costs, such as energy usage (which is highly related to the number of and power consumed by the lamps).

HID lamps are typically categorized by rated operating power; as electrical energy consumed tends to correlate with light output. For example, one category of sports lighting lamp is rated at 1000 watts. Another is at 1500 watts. A 1500 watt rated lamp normally would generate more light output than a lamp of the same general characteristics but rated at 1000 watts, if both lamps are operated at or near rated power. But, as the rating implies, the 1500 watt lamp would normally consume more electrical energy per time period of operation than a 1000 watt lamp. Examples of several 1500 watt rated lamps are the Switch Start MH Std 1500 W Mog BT56 CL model commercially available from Philips Lighting Company, 200 Franklin Square Drive, Somerset, N.J. 08875 USA, and the MS 1500W/HOR/XP/SPORT 60 model commercially available from Venture Lighting, 32000 Aurora Road, Solon, Ohio 44139 USA.

To design a lighting system, an assumption is made as to the amount of light that can be expected out of the lamps, which usually are of the same rating and from the same manufacturer. However, the large variance in actual light output, described above, presents the following serious problems for the design and installation of lighting systems of this nature.

As is known in the art, sports lighting, a type of wide-area lighting, usually must meet certain lighting criteria to meet specifications that are often imposed for a particular location or application. Organizations such as the Illuminating Engineering Society of North America (IESNA) and others have developed sports field illumination intensity and uniformity minimums for different sports that are many times used for these purposes. Many customers specify that such standards be met by the entity installing the sports lighting system.

Presently, the lighting system designer typically relies on lamp manufacturer information regarding such things as the amount of light output, its operating efficacy, its color, and its longevity when trying to design the system to meet the light intensity and uniformity specifications. However, lamp manufacturers often provide only generalized information for each lamp type. For example, a typical manufacturer may provide one or more of the following information with each type of lamp: (1) nominal or rated initial light output (RILO) (predicted lumens after 100 hours of operation); (2) nominal or initial power use (predicted lumens per watt); (3) mean light output (predicted average lumens at 40% rated life for lamp); (4) rated life of lamp (predicted median life span of large number of the type of lamp based on predicted time when 50% will fail); (5) predicted color; and (6) best lamp operating position. Some may give a general idea of predicted lamp lumen depreciation for the type of lamp (lamp lumen depreciation (LLD) is the reduction in lamp light output that progressively occurs during lamp life) (e.g. LLD curve of FIG. 1).

Take for example the generalization of LLD. It is sometimes defined to be a ratio between (a) predicted light output from the HID lamp at a specified cumulative operating time after initial start-up and (b) RILO. RILO (e.g. see FIG. 1) is usually provided by manufacturers and expresses the total light output in lumens after 100 hours of seasoning or "burn-in". The lumen refers to a unit measurement of the rate at which a lamp produces light. As defined by IESNA publication LM-54-1991, "IES Guide to Lamp Seasoning", lamp seasoning requires operation of an HID lamp for a considerable period of time until photometric, colorimetric, and/or electrical characteristics are constant. The publication advises this seasoning is required before any photometric, colorimetric or electrical test measurement should be collected. Seasoning for HID lamps is stated to be 100 operation hours at recommended operating parameters.

RILO is usually based on random testing of the type of lamp by the manufacturer. But since no two lamps are identical on these points, this information is a generalized estimate for all lamps of one type. As stated earlier, lamps of identical nominal operating wattage and other characteristics, make-up, or structure can vary dramatically in lumen output from each other when operated, and the magnitude of the variance can be substantial (e.g. +/−10% or more). Therefore, using the lamp manufacturer's information is not only generalized for all lamps of that particular type, but merely an educated guess for individual lamp performance for that type. Thus, when designing a system, it becomes somewhat of an educated guess as to what type, number, and RILO of lamps should be used for a given application, i.e., the use to which the lighting system will be put.

If, for example, a number of the lamps in operation produce actual light output substantially lower than assumed or manufacturer's generalized estimated light output for that type of lamp, lighting requirements for the lighting system might not be achieved when the system is installed and operated. In order to do so, the lighting system installer might have to add additional lighting fixtures after the initial installation. By lighting fixture (also referred to as a luminaire) it is meant a complete lighting unit consisting of lamp (or lamps) and the parts designed to distribute the light, position and protect the lamp(s), and connect the lamp(s) to the power supply.

The addition of lighting fixtures can be very costly to the installer and manufacturer due to extra labor, extra product cost, and potential concerns for structure loading to handle extra fixtures. Also, additional electrical equipment is needed, and the existing wiring and components may not be adequately sized for the extra electrical load of the fixtures. This can be particularly problematic if the discovery of insufficient light for the application occurs after the original lighting system is installed. As can be readily appreciated, many wide-area lighting systems must elevate the lighting fixtures to substantial heights (e.g. 30 to 150 feet). Poles or superstructure to do so are expensive and resource-intensive to install. If lamps have to be retro-fitted after initial installation, this can be quite expensive and burdensome.

Even if lighting output is just slightly low from, for example, a four pole lighting system (with three lighting fixtures per pole), the installer may have to add one fixture per pole to balance out the uniformity of light and the appearance of the fixtures on the pole. This could add on the order of 25% more fixtures. This may meet specifications, but the cost is substantial. It also may result in too much light. Many times light pollution (e.g. glare, sky glow, and spill light) must be carefully controlled. Too much light can upset the design relative to light pollution specification or restrictions. In addition, excess light from added sources or fixtures consumes extra energy, which increases operating costs. Sometimes, instead of or in addition to adding one or more extra lighting fixtures per pole, an extra light pole is needed or added to add additional fixtures, which can add significant capital cost to the lighting system.

As noted, one state of the art attempt to solve this issue is to simply add lamps and/or poles to the initial design, assuming that at least some lamps will under-perform the lamp manufacturer's estimate. But also, excess light is also a concern if the lighting system is over-designed due to better performance from the lamps than assumed in the design calculation. Having more light than needed is generally better than not enough light, but it consumes more energy than necessary to light the area per the defined specifications. Excess light may also add cost to the project due to extra fixtures and structure cost that are not needed. Thus, lamps that produce more light output than predicted by the lamp manufacturer are not used in efficient manner. Glare and spill light issues can also be created.

As indicated earlier, there might be as much as approximately + or −12% differences between low and high ends for sports lighting HID lamps. A typical range is at least +/−7%. The lighting system installer has no control over this variance. Light manufacturers are believed to do sporadic testing. Perhaps they test one to four out of 5,000 lamps. One possible reason for the low quantity of lamps tested is the cost to operate the lamps during testing and the required time of testing. HID lamps generally require a 100 hour "burn-in" or previously-described "seasoning" period to stabilize the lamp to allow for accurate measurement or estimate of light output. An HID lamp's lumen output may decrease as much as 20 percent or more in the first approximately 100 hours of use (some HID sources have other "burn-in" times; typically within a range of between approximately 50 and 200 hours). This is why lamp manufacturers will generally provide an estimate of initial lamp lumen output at the 100 hour (or other seasoning or burn-in) mark. This value is referred to in the art as "initial light output", "rated light output", or "rated lumen" for the lamp. It will be referred to herein as "rated initial light output" or "RILO" in lumens ("lm") after 100 hours of seasoning.

It is simply not practical or cost effective for lamp manufacturers to test each and every lamp for actual performance. Thus, as previously stated, lamp manufacturers' lamp performance information, e.g. "100 hour burn-in" light output, rated life, mean light output, LLD, are predicted values only. An example of a typical lamp manufacturer 100 hour light output published RILO and an LLD curve estimate (if provided by lamp manufacturer) are set forth at FIG. 1. A lighting system designer can use these types of information to get a generalized, estimated prediction of lamp performance, but actual lamp performance may vary significantly.

Therefore, this is a real problem in the industry. It would be beneficial to more accurately know or predict the light output that will be put into fixtures in a lighting system.

A few specific examples illustrate some of the problems in the state of the art. As previously stated, lamp lumen output may vary by +/−7%, or more (sometimes up to on the order of +/−12%) from nominal published output or RILO for a type of lamp. This variation in output can have a positive or negative impact on the actual light output to the target area. It may cause the area to be over-lighted, or perhaps under-lighted.

Example 1

Consider, for example, a typical baseball field lighting design (referred to herein as "Design One") using a 1500 watt metal halide lamp with a RILO of 155,000 lumens. Based on this design, utilizing twenty fixtures will provide predicted light on the target area of 50.55 horizontal foot-candles (fc) in the infield area and 30.37 horizontal fc in the outfield area. Horizontal fc is the horizontal illuminance or average density of luminous flux (in fc or lux) incident on a horizontal surface, here the field. For lighting criteria of 50 fc in the infield and 30 fc in the outfield, any deviation in the light output of the lamps below the RILO value will likely cause the actual field light levels to be lower than the desired lighting criteria of 50/30 fc. Thus, if a number of the lamps under-perform RILO substantially, the lighting system using the manufacturer's RILO will not meet illuminance specifications.

Example 2

Then consider another design ("Design Two") which is the same design as Design One, only the lamp lumen or light output used by the designer to calculate the predicted values is 7% below the RILO value of 155,000 lm. In this Design Two the lamp lumen output used would be 144,150 lm instead of the nominal RILO 155,000 lm per lamp. If the lamps of this predicted value did actually operate at this value, the actual light level would be closer to 47.01 horizontal fc in the infield and 28.25 horizontal fc in the outfield. This would not meet the lighting criteria of 50/30 fc and would require modification of the system to increase the light level to the minimum level. However, if the lamps actually operated with lamp lumen output 7% higher than the nominal RILO value of 155,000 lm, excess light may be present and energy wasted.

Example 3

Consider a still further "Design Three" of the same design as Design One, only the lamp lumen output used to calculate the predicted vales is 7% higher than the nominal RILO output of 155,000 lm. In this Design Three, the predicted lamp lumen output is 165,850 lm instead of the nominal RILO 155,000 lm per lamp. If lamps of this predicted value actually produced that predicted value, the actual light level would be closer to 55.10 horizontal fc in the infield and 32.41 horizontal fc in the outfield. This certainly meets the previously mentioned lighting criteria of 50/30 fc, however it is wasteful. Note also that even though the energy consumption is the same in all three designs Design One, Design Two, and Design Three (because they would all be operated at rated operating power of 1500 watts), the energy for Design Three could be minimized by removing excess lighting fixtures.

These examples show, therefore, some of the significant issues that are created because of having to rely on a rough RILO estimate of lamp output when designing lighting systems. Lamp output is not controllable. The variability can adversely affect a lighting system in a number of ways. It can cause a lighting system design or installation to fail to meet required specifications. This can cause expensive modification of the installed system. As mentioned, some designers over-design light output to hedge on this point. However, this can cause increased capital cost to the end-user, but also increased cost over many years in energy usage.

Furthermore, there can be similar variability between lamps of the same type, including from the same manufacturer, for lamp characteristics other than light output. One example is energy consumption or lamp efficacy, defined here as the ratio of the light output of a lamp (lumens) to its active power (watts), expressed as lumens per watt (LPW). Another is color stability, here meaning the ability of a lamp or light source to maintain its color rendering and color appearance properties over its life. The color properties of some discharge light sources may tend to shift over the life of the lamp. Lamps of the same type made by the same manufacturer may exhibit a certain degree of variation in color, even when operated under the same conditions and seasoned for the same about of time. Color shift relates to the change in a lamp's correlated color temperature (CCT) at 40% of the lamp's rated life, in Kelvin (K). Color rendering is a general expression for the effect of a light source on the color appearance of objects in conscious or subconscious comparison with their color appearance under a reference light source. A still further example is lamp longevity. Longevity can be correlated to measurable characteristics of an HID lamp and can have substantial variability from lamp-to-lamp of the same type.

Therefore, like lamp light output, the lighting designer typically relies on generalized information from the lamp manufacturer regarding these types of lamp characteristics (e.g. lamp efficacy, color stability, and longevity) which can create difficulties for the lighting system designer analogous to those described above with respect to lamp light output. There is also room for improvement in the art with respect to the ability to more accurately know or predict other characteristics of HID lamps that tend to have variability from lamp-to-lamp.

II. BRIEF SUMMARY OF THE INVENTION

It is therefore a principle object of the invention to solve problems and deficiencies in the art. A way to more accurately estimate performance over normal BID lamp operating life of typically thousands of hours is to classify each lamp individually based on an evaluation of each lamp, not on random sampling and generalized predictions.

In a method according to the invention, each HID lamp is classified as to its estimated or predicted performance based on a lamp-by-lamp evaluation. The evaluation involves operation of each lamp for an initial, relatively short period. In one example, it is operated to get the lamp up to at or near normal operating temperature. In the case of light output as the lamp characteristic, actual light output is checked or measured at the end of the initial, relatively short period of initial operation (which is usually substantially shorter than the normal 100 hour or so "burn-in" or "seasoning" period for HID lamps). This actual light output reading or measurement is used to classify each lamp into one of at least two classifications. In one aspect of the invention, each classification is defined by the magnitude of offset of the actual light output measurement from a reference value. In one example, the reference value is the rated initial light output or RILO for that type of lamp. This nominal initial lumen output or RILO value can be obtained from the lamp manufacturer. Optionally, it can be based on field or laboratory testing of light output from test lamps of the same type and same manufacture. The actual light output measurement value can be adjusted from its value at the relatively early measurement time to an extrapolated value at its future "burn-in" or "seasoning" time. Then the adjusted or extrapolated measured value can be directly compared with RILO and the magnitude of any offset used to classify the lamp. Each class is correlated to predicted lumen output performance over normal operating life.

In one aspect of the invention, there are three classifications, namely high, average, or low performing. The "average performing" class is designated when a comparison of adjusted measured value and the reference value is within a margin of error on either side of the reference value (e.g. adjusted early actual lumen output measurement value minus RILO reference value is within the margin of error, whether positive or negative). The "high performing" class is designated when a comparison of adjusted measured value and the reference value exceeds the margin of error on the positive side (e.g. adjusted early actual lumen measurement value minus RILO value is outside the margin of error and is positive). The "low performing" class is designated when a comparison of adjusted measured value and the reference value exceeds the margin of error on the negative side (e.g. adjusted early actual lumen measurement value minus RILO value is outside the margin of error and is negative).

According to another aspect of the invention, a method includes the following steps: (a) obtaining a physical measurement of a lamp characteristic from each lamp (not from just a sampling of a small percentage of lamps) of similar or same type, where the measurement is taken after a relatively short period of initial operation (can be a few hours or even minutes instead of many hours); (b) classifying into at least two classes the measurement for the measured lamps relative to (1) each other or (2) some reference parameter based on a priori testing or information regarding the type of lamp; and (d) correlating each classification to predicted performance of the lamp over its normal operating life. Examples of the lamp characteristic include, but are not limited to, lumen output, color, lumen output per watt, and longevity.

In another aspect of the invention, lamp classification allows the lighting designer to use the lamp output that best fits the application. Out of a batch or inventory of same or similar type lamps, the designer or system manufacturer/assembler could sort and select only those from a single classification. For example, some applications may require or beneficially use lamps classified by the method as high performing lamps to achieve the target lighting criteria or to minimize the fixture count and energy usage. In another example, lamps classified as average performance lamps (as compared to high performing) may be selected for applications with less stringent lighting criteria or where the light output from average lamps is sufficient for the need. Likewise, lamps classified as low performing lamps (as compared to high or average) may be used in applications that do not have a lighting criteria established, or where the quantity of fixtures has been minimized and extra light is not needed beyond that provided by the low performance lamps. This is not to say that low performance lamps are bad lamps, simply that they have light output below the nominal value established by the lamp manufacturer. On the other hand, a combination of lamps from different classes could be used in the same lighting system design. For example, if a two class method identifies either high or low performing lamps; both could be utilized to meet a design criteria. In that case, all lamps could be used (none would have to be set aside and not used, or used in other applications). But the lamp-by-lamp classification would identify which lamps are high performing and which are low performing. This allows the designer to, for example, place lamps from the two classes in positions that can be advantageous to the overall lighting design or mix them appropriately to get an over-all average lamp performance for the system.

In another aspect, the invention can provide a better prediction of the amount of light output, or other lamp characteristic, that is available to put in a lighting fixture on a lamp-by-lamp basis.

These and other objects, features, aspects, or advantages of the invention will become apparent from the accompanying specification and claims.

III. BRIEF DESCRIPTION OF THE DRAWINGS

IV. DETAILED DESCRIPTION OF EXEMPLARY EMBODIMENTS

A. Overview

Figure 1:
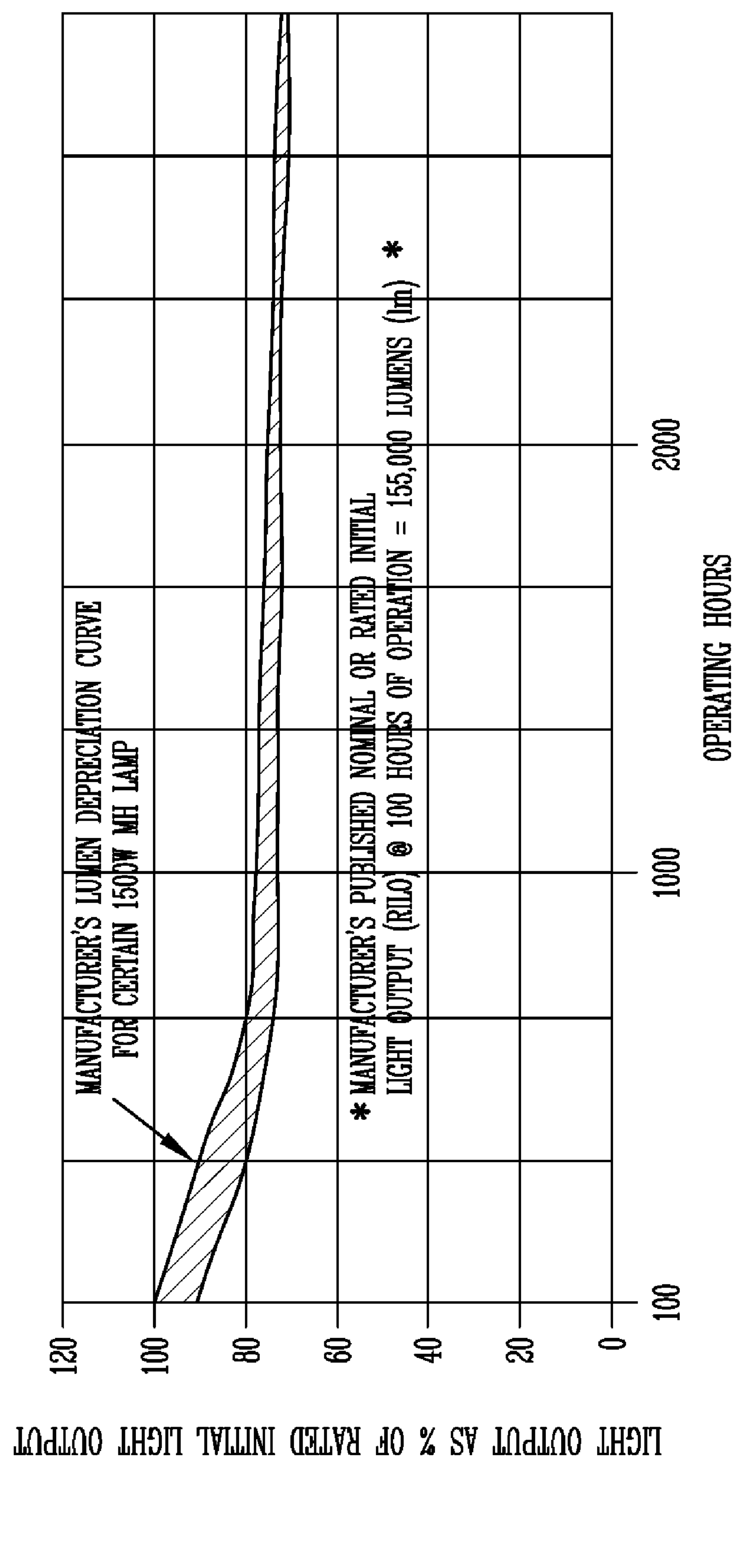
FIG. 1 is a hypothetical published lumen depreciation curve for a specific type or model of HID lamp from the lamp's manufacturer, and a hypothetical manufacturer's published nominal or rated initial light output after the burn-in or seasoning period (KILO).

For a better understanding of the invention, exemplary embodiments will now be described in detail. Reference will be made from time-to-time to the drawings, which are identified by Figure number. Reference numbers and/or letters will be used to indicate certain parts or locations in the drawing.

It is to be understood that these exemplary embodiments are but a few forms the invention can take. The invention is not limited by these embodiments but is defined by the claims herein.

B. First Exemplary Embodiment

The following is detailed description of an exemplary method and system to classify lamps based on an actual operating metric or parameter for each lamp.

In general, the method measures the metric for each lamp. The metric is measured lumen output early in lamp operating life, after a relatively short period of operation, and then extrapolated to a lamp lumen output at a later time of cumulative time of lamp operation.

The time of the actual measurement is an approximation of when the lamp type would achieve relatively normal operating temperature after initial start up (for 1500 watt metal halide lamps at approximately 20 minutes of operation).

The later time is what is known in the art as the seasoning time or burn-in time for the type of lamp (for 1500 watt metal halide lamps at 100 hours of operation).

The extrapolated light output value at the later time is compared to a reference value of light output for the type of lamp; specifically nominal or rated initial lumen output after seasoning or burn-in (e.g. 100 hours) or RILO (available from the manufacturer).

A plurality of classifications are defined, each including a discrete and different range of values for the value extrapolated from the measured metric. Each classification is correlated to an estimated future performance of the lamp throughout the lamp's life.

Figure 2:
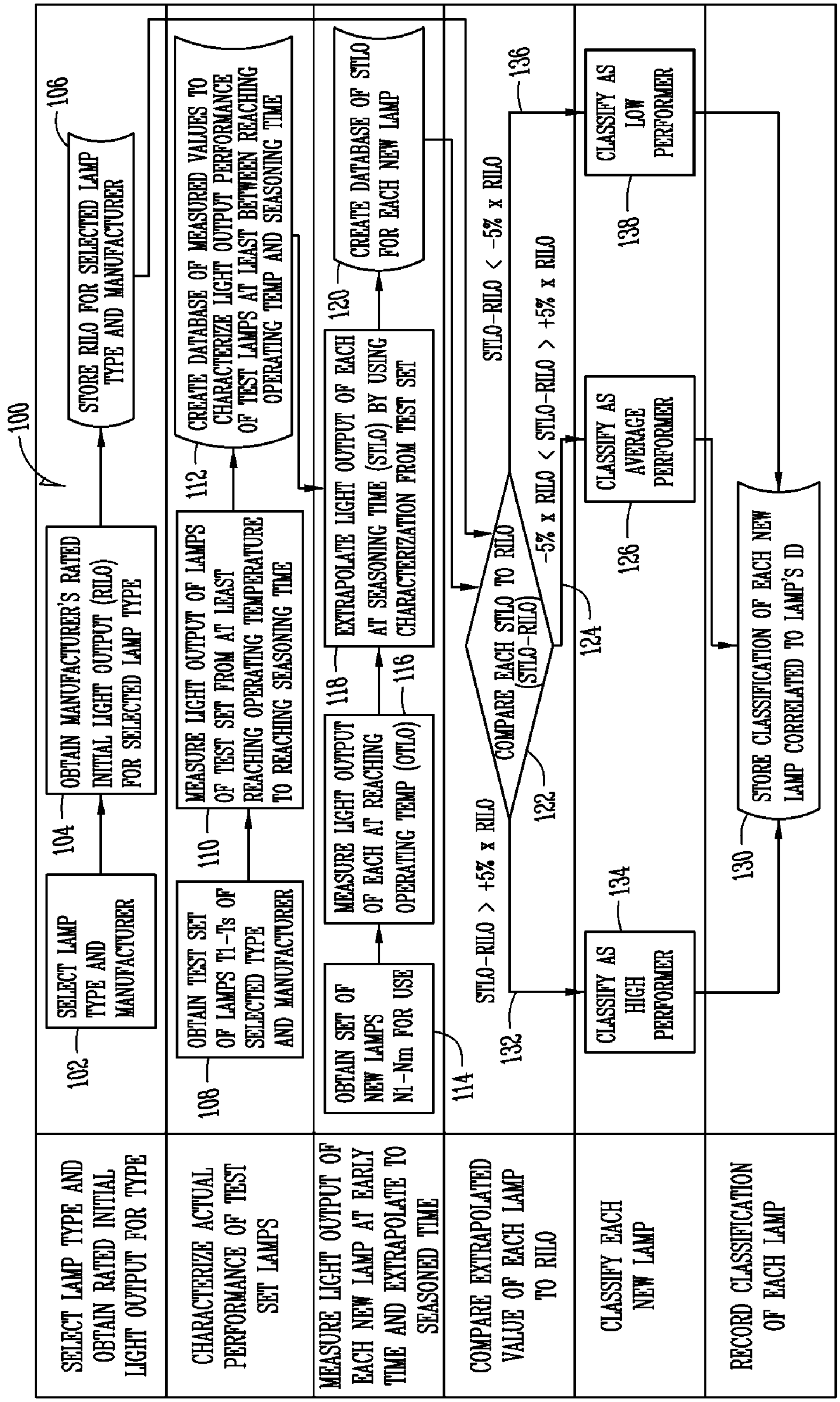
FIG. 2 is a flow chart of a method according to an exemplary embodiment of the present invention.

FIG. 2 sets out a specific method 100 according to an exemplary embodiment of the invention. Method 100 results in a classification of each of a set of new 1500 Metal Halide (MH) HID lamps of a single type and manufacturer into one of three classes; namely "high performing", "average performing", and low performing". By "new lamp" it is meant a lamp that is purchased as new from a manufacturer for use in an application. The lamp has not been operated for any substantial period of time. The lamp manufacturer may operate the lamp for a brief time (e.g. to turn it on and off for a few seconds) before selling it.

1. Lamp Selection

A lamp type and manufacturer are selected (FIG. 2, step 102). By lamp type it is meant a single model having the same essential characteristics (e.g. rated operating wattage, color, operating position, etc.) from the same manufacturer.

The RILO for the selected lamp is obtained (step 104). The RILO for the lamp type is stored or recorded for later use (step 106). As previously discussed, the lamp manufacturer normally publishes information about the lamp including rated initial light output (RILO) in lumens (similar to that set forth in FIG. 1). The lamp manufacturer also may publish an LLD curve for the type of lamp, similar to that shown in FIG. 1. The lamp manufacturer also normally provides a date or lot code for each lamp, from which manufacturer and lamp type can be derived.

The type of lamp selected can be based on any number of factors. One would be a rated light output estimated to be desirable for a given application. In the case of sports lighting, 1000 to 1500 RILO metal halide BID lamps are deemed desirable because of light output, color, rated lamp life, and cost, among other things. Other reasons for selection of a type of lamp can, of course, exist.

There are other ways to obtain the equivalent of a RILO value. Alternatively, some other reference value can be used instead of RILO.

One example is to utilize some other published lumen output estimate from the manufacturer. Some manufacturers' publish a mean lumen output value at 40% of rated lamp life. However, as previously mentioned, these tend to be generalized estimates for the entire type of lamp and individual lamps can vary from them substantially.

Another way to obtain an analog to RILO is as follows. As stated, the lamp manufacturer usually publishes a predicted lumen output for a lamp at the point the manufacturer believes it will be stable. For HID lamps, this is normally after the initial "burn in" period (usually around 100 hours). In typical HID lamps some lumen depreciation (sometimes referred to in the art as lamp lumen depreciation or LLD) occurs during that burn in period. LLD can be on the order of up to 20%, even for this relatively short "burn in period". But it is impractical for the lamp manufacturer, or the conventional users of the lamps (the lighting designer, the lighting installer, or the end user of the lighting system) to run each lamp individually for 100 operating hours. But, as an alternative to using RILO, the lamp lumen depreciation curve (e.g. FIG. 1) available from the manufacturer could be used in combination with field or laboratory testing to obtain what might be considered a more accurate RILO for the type of lamp selected. A reasonable number of test lamps of the same type could actually be operated until seasoned (e.g. 100 hours) and then light output measured. This could be compared to the manufacturer's RILO. If any adjustment is deemed necessary or prudent, the manufacturer's RILO could be weighted or changed based on the testing.

As can be appreciated, other information and/or laboratory or field testing could be used. The manufacturer's RILO could be ignored.

2. Derive Representative Lumen Output Performance for Type of Lamp Selected

After the type of lamp is selected and its RILO obtained, method 100 conducts laboratory and/or field testing on a reasonably representative set of test lamps of the same type and manufacturer as the selected lamp of step 102 (see FIG. 2, step 108).

Specifically, a test set T1, T2, . . . , Ts (where s=a variable) of the type of lamp selected in step 102 is put to laboratory and/or field testing over a substantial period of time (FIG. 2, step 110). Contrary to conventional practice, the testing measures actual lamp lumen output from very early in actual operating time at least through the 100 hour seasoning time.

The test set T1-Ts comprises a relatively large number of lamps of the same type (e.g. s=20 to 50 or more). Usually the number is selected to likely include a reasonably good mix of what are high, average, and low performers. Using conventional photometric measurement equipment, such as is well-known in the art, lumen output is measured and recorded at pre-determined intervals from zero operating hours through 100 hours, and beyond; for example at: 10 minutes (min.); 20 min.; 30 min.; 1 hour (hr); 2 hr; 5 hr; 10 hr; 25 hr; 50 hr.; 100 hr; 200 hr; 400 hr; 800 hr; 1600 hr; 2000 hr; 3000 hr. under the same or similar operating parameters (e.g., manufacturer's suggested operation or otherwise) as the intended application(s) for the lamps (e.g. sports lighting, parking lot lighting, etc.). Of course, different intervals could be selected. The timing and number of data points could be based on a variety of factors, including time, resources, desired resolution, etc. The chart in FIG. 4 illustrates how these measurements could be recorded relative to each test lamp T1-Ts.

Using these measurements, a database of actual lumen outputs for each test lamp of the test set can be created over a substantial portion of at least rated lamp life of the type of lamp (FIG. 2, step 112). Rated life is defined as estimated useful life for the type of lamp based on a prediction when 50% of lamps will fail.

Figure 4:
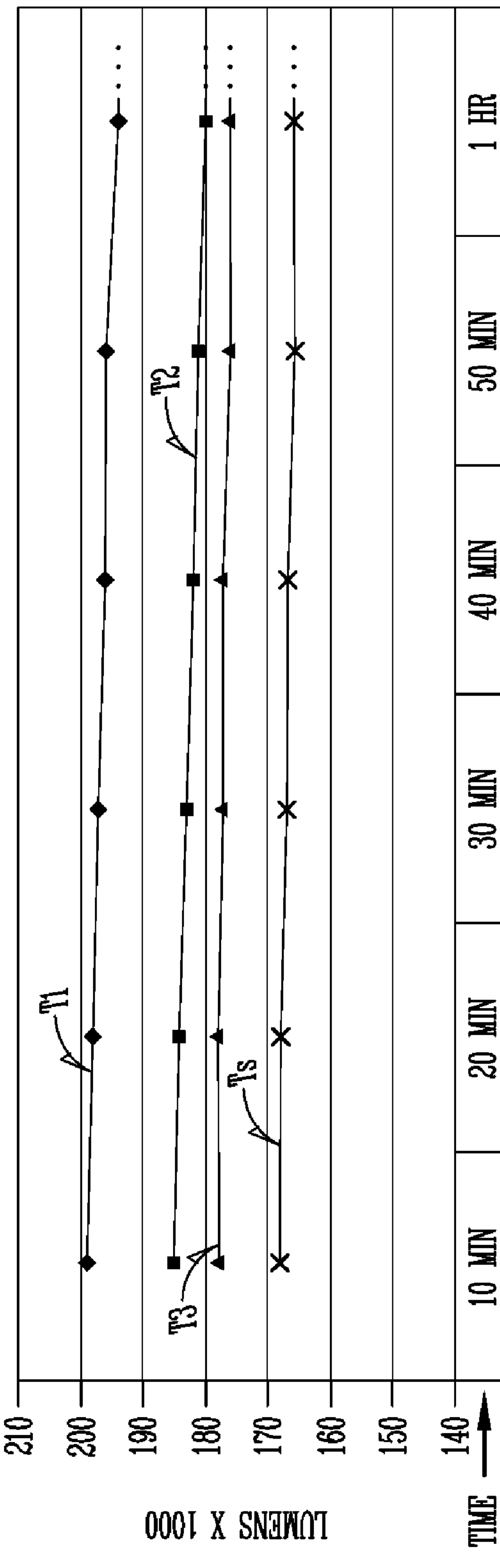
FIG. 4 is a chart of actual measured lumen output values of a number of test lamps of the same type over a substantial portion of rated or normal operating life for that type of lamp, and graphed lumen depreciation curves for those test lamps interpolated from the data points in the chart.

As diagrammatically illustrated in FIG. 4, this allows a substantial data set of lumen output performance for each lamp. Essentially, a lumen depreciation curve can then be interpolated from the actual measurements for each lamp can be created. Thus, if the test set is relatively representative of all lamps of the type of selected lamp (e.g. a reasonably complete, random sampling of variability of lumen output performance for all such lamps), a database of performance curves can be created and stored for reference.

FIG. 4 is intended to illustrate how the discrete measured data points of the chart of FIG. 4 can be graphed as continuous curves related to each test lamp T1-Ts. For simplification and illustration, FIG. 4 shows only four curves T1, T2, T3, and Ts. There would actually be many more (e.g. in this example between 20 and 50) such curves based on similar data points for each. Therefore, a limited number of discrete data points can be used to interpolate values continuously along operating time for each test lamp. This provides a representative actual lamp performance curve for a reasonable number of the type of selected lamp. This test set information is stored (step 112) for later use in method 100. Although such testing can involve substantial resources, it is for a limited number in the test set. It can be then be used in the future so long as there are no substantial changes to the type of lamp.

The user of method 100 can select when the data points occur for each test lamp and how many are taken for what portion of rated life. In a more extreme case, the measurements are taken relatively close together and for the entire rated lamp life. This would create a database which provides example lumen output performance for a representative sampling of test lamps for the entire normal operating life of thousands of hours. However, a more practical approach is illustrated by the data points described earlier, where measurements are quite close between zero and 100 hours, and thereafter farther apart. As mentioned, data points can end at or shortly after 100 hours to further reduce testing overhead.

As can be appreciated, closely-spaced actual measurements would produce much more data of actual lumen output performance for each of the tested lamps and would not take much interpolation to create a continuous lumen output curve or line. On the other hand, less frequent measurements would lessen the measurement overhead, but would require more interpolation.

Therefore, the present embodiment of the invention, through field testing and laboratory testing, creates essentially a model of lumen output performance of that type of lamp based on actual lumen output measurements, including at (or even prior to) the lamps achieving what is known as "operating temperature" (here 20 minutes or so after a new lamp is first operated), and prior to "burn-in" or "seasoning" (here 100 hours or so of cumulative operation after a new lamp is first operated). One would therefore know better how the lamp will actually likely perform because of this prior actual testing of a good test set mix of the type of lamp. The state of the art has ignored these periods and has, as stated in the IESNA publication, considered 100 hours as the earliest time the lamp is stable enough to take actual measurements.

Figure 3:
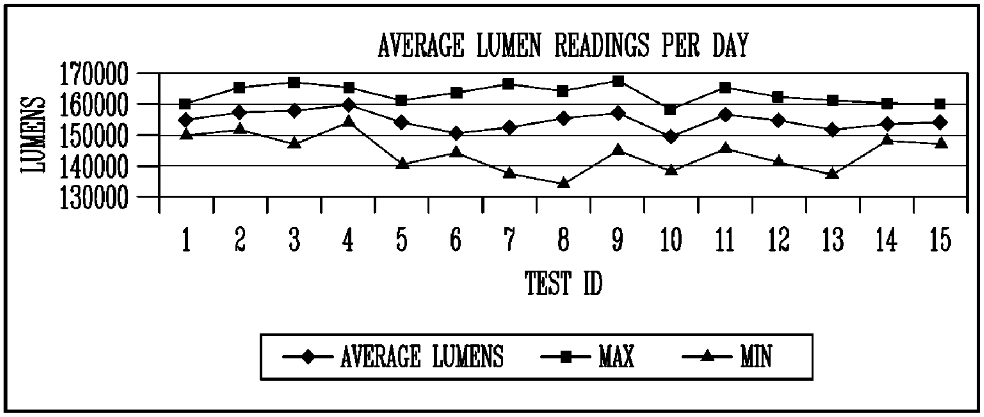
FIG. 3 is a chart illustrating variability in actual measured lumen output values after 20 minutes of operation for a number of groups of the same type of HID lamp, as well as maximum, minimum, and average for each group and for all the tested lamps, and a graph of the values of the chart.

FIG. 3 shows results of actual lumen output measurements for several groups or sets of the same type and nominal operating wattage HID lamps by empirical and field testing. Although the results are all at just 20 minutes of operation (at operating temperature), they illustrate the variability of measured lumen output between lamps in each set and between lamps across sets. The specific data of the chart of FIG. 3, and the graph of the data, show the highest measured lumen output lamp from each set and the lowest, and then shows an average lumen output for all lamps in each set. Highest and lowest lamp overall from all sets, as well as overall average of all lamps are also shown. The range of highest and lowest of each set and the average of each set is shown. Note the variance but also note the variance in the range between sets. Each set does not always have the same range from highest to lowest or the same average. This testing shows why reliance on a generalized manufacturer's predicted lumen output can have a relatively large margin of error. But it also shows that lamps of the same type have variability between the group averages of only about +/−3%, even though the measurements are taken at what the state of the art considers to be an unstable time for such measurements.

It has been found through this type of laboratory and field testing that lumen output of lamps do behave quite similarly over time, including between zero operating hours once achieving operating temperature (e.g. here around 20 minutes), and prior to burn-in or seasoning time (e.g. here 100 hours). Therefore, as diagrammatically illustrated in FIG. 4, the curve for each test lamp T1, T2, . . . , Ts tends to be relatively parallel. In other words, it has been found that a lamp with a higher 20 minute lumen output reading would not depreciate in lumen output at a substantially higher or lower rate than a lamp with a lower 20 minute lumen output reading. The curves tend to be separated but generally parallel.

Other methods could be used to derive reference information regarding lumen output performance of a test set of lamps. And a different length of measurement time could be selected. For example, measurements might be taken between just 0 and 100 hours, or just between 20 minutes and 100 hours. This would, however, lose reference data based on actual measurements for the thousands of hours of rated life after 100 hours.

Another option would be to produce an average of the curves of FIG. 4. For example, one curve representing an average of all the lamps of the test set could be created as a reference. Some other characterization of the test set data in a form useful for comparison to RILO (or other reference) can be created.

3. Measure Actual Lumen Output at Relatively Early Operating Time

Once the reference values according to steps 108-112 have been established and recorded for test set T1-Ts, method 100 proceeds towards classification of individual lamps as follows.

A set of new lamps N1, N2, . . . , Lm of the type selected in step 102 (and the type tested in steps 108-112) are purchased from the manufacturer (FIG. 2, step 114). In method 100, each new lamp would be assigned its own unique identifier (e.g. a unique serial number or I.D.). By "new lamp" it is meant a commercially purchased lamp presented by the manufacturer as new. As known in the art, the lamp may have been turned on a few times very briefly by the manufacturer, but generally has not been operated continuously.

Each new lamp is taken from its box and operated continuously for a relatively short period of time under the same or closely similar operating parameters as the test set and its ultimate intended application (e.g. lamp operating position, voltage, current, etc.). In this embodiment, the time is 20 minutes (see FIG. 2, step 110). This is selected for the type of 1500 watt MH lamp cited above because it is the generally acknowledged time at which such lamps reach operating temperature. Measured light output at this time will sometimes be referred to herein as operating temperature light output or OTLO.

Operating temperature is here defined as the time from the point at which voltage is applied to a new lamp until its electrical characteristics are generally stable. This is also sometimes referred to as "starting time". For 1500 Watt Metal Halide HID lamps, operating temperature is typically deemed achieved after 20 minutes of operation. In method 100, each new lamp is measured at 20 minutes after application of voltage or wattage to the new lamp (step 116).

Confirmation of stable electrical characteristics could be measured by monitoring lamp voltage. If lamp voltage is not continuing to rise at 20 minutes, it can be assumed operating temperature has been reached. If it is continuing to rise, measurement can be delayed until it levels off. If measurement of electrical characteristics is used to confirm the lamp has reached operating temperature, actual light output measurement might be made earlier than 20 minutes if the lamp reaches operating temperature earlier than 20 minutes. Therefore, electrical stability could be repeatedly tested earlier than 20 minutes to see if testing can commence earlier than 20 minutes. Alternatively, electrical stability could be tested at 20 minutes to confirm the lamp has reached operating temperature.

Other measurement points or times are possible. Other lengths of time are possible. However, they generally would be relatively short. By relatively short it is meant to be shorter than the typical burn-in time for the type of lamp, and usually much shorter. Normal burn-in times are 50-200 hours, and considered by many sources to be at least 100 hours for HID lamps. In one aspect, relatively short is 4 hours or less. In this example, it is under one hour; specifically 20 minutes or ⅓ of an hour.

Figure 5:
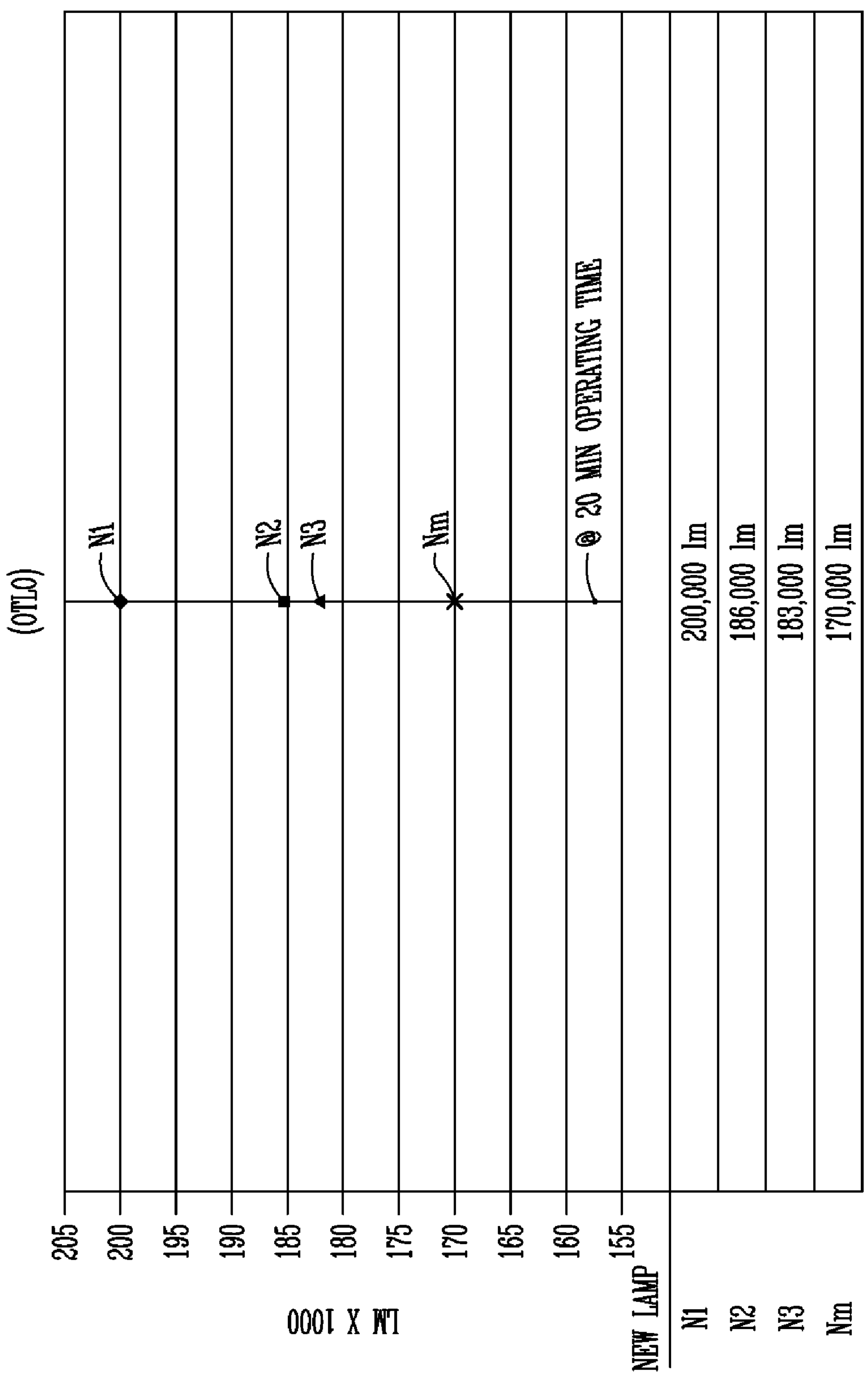
FIG. 5 is a chart of actual measured lumen output values of individual new lamps at 20 minutes of operation, and a graph of those values.

At the end of 20 minutes of operation of each new lamp N1-Nm (where m=a variable), operating temperature lumen output (OTLO) for the individual lamp is measured by conventional means and recorded in a form that is correlated to its unique identifier (its unique serial number) (FIG. 5). A variety of measurement methods for lumen output are available and well-known in the art. An example is a photometric testing station (e.g. standard luminaire testing photometer). A number of independent testing laboratories or companies can provide such services. Alternatively, such test stations can be purchased and set up for personal use.

Optionally, other operating characteristics of the lamp can also be measured at the same 20 minute point of operation, and recorded with correlation to the lamp serial number or other identifier. Examples are color temperature and spectral power distribution. Another is temperature. Another is electrical characteristics, including but not limited to lumens/watt, operating voltage or current, operating cycle, apparent power, active power, current crest factor, current total harmonic distortion (THD), and impedance. Methods to do so are well-known in the art. This additional information could be stored in a database and associated with each lamp.

4. Extrapolate STLO from OTLO

As discussed further below, classification of each new lamp will be based on a comparison between the actual OTLO measurement for each new lamp to the lamp manufacturer's published RILO for that same type of lamp or other reference.

First, however OTLO must be, in a sense, normalized to 100 hr. burn-in or seasoning time. As described above, OTLO is measured at 20 minutes of lamp operation. RILO is related to time of lamp seasoning or 100 hours of operation. Method 100 therefore normalizes these values to the same time point, namey 100 hours, as follows (see FIG. 2, step 118).

Figure 6:
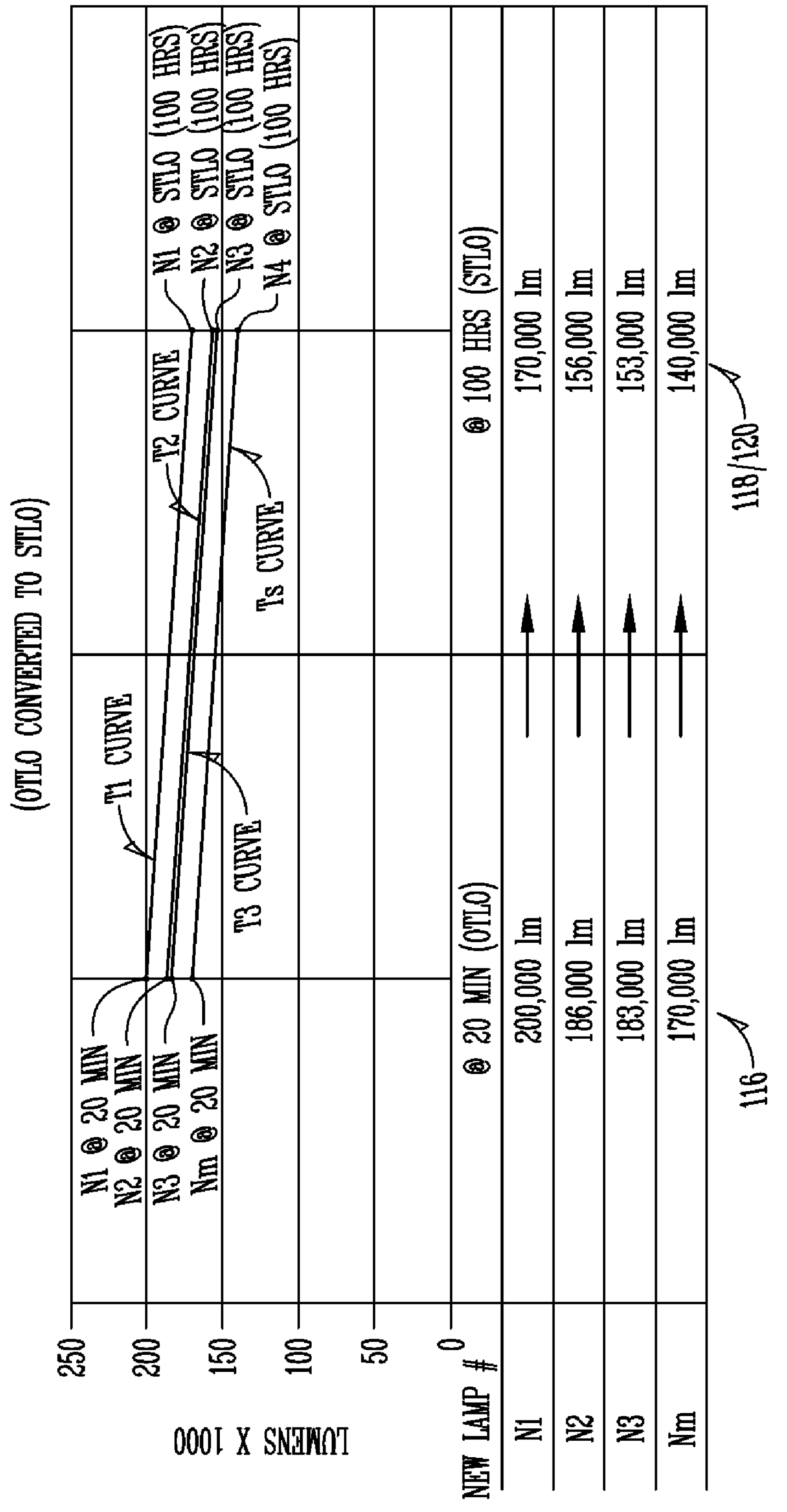
FIG. 6 is a chart of the 20 minute measured values of FIG. 5 extrapolated to 100 hour values (STLO) for each new lamp based on the data and curves of the test set of lamps of FIG. 4.

The previously obtained reference information about the test set of lamps from steps 108-112 (see also FIG. 4) is used. Take for example new lamp N1. Its measured OTLO value (i.e. 200,000 lm, see FIG. 5) can be directly correlated to the closest curve for that same 20 minute time for a test lamp T1-Ts in FIG. 4 (i.e. the curve associated with test lamp T1 in FIG. 4 because its 20 minute value is closest of the curves to 200,000 lm). Then, because of the a priori test lamp testing gives a reasonable prediction of what a lamp of that type would produce for lumen output anywhere from zero to 100 hours of operation (and beyond), the T1 curve can be used to extrapolate a lumen output of 200,000 lm at 20 minutes to a lumen output value for new lamp N1 at 100 hours by following the T1 curve from its 20 minute value to its 100 hour value. This is illustrated in FIG. 6, where N1 at 20 minutes (198,000 lm) is plotted, the T1 curve is then superimposed or used, and the T1 curve value at 100 hours (170,000 lm) can be obtained (see N1 value @ STLO (Seasoning Time Light Output) in FIG. 6). In simplistic form, one simple has to match OTLO with the most relevant test lamp curve and follow that curve to the 100 hour time. This 100 value is then selected as the extrapolated value for OTLO or the STLO value for that particular new lamp.

Another method of extrapolating STLO from OTLO is as follows. As previously mentioned, the actual measured test data from the test set of lamps Ti-Ts could be characterized as a percent light loss per specific operating time period. For example, test data has shown that most, if not all, lamps of this type tend to exhibit the same or quite similar rate of light loss over cumulative operating time. Thus, percent light loss for the test set of lamps between OTLO and 100 hours can be expressed as a single value and used to extrapolate STLO from OTLO for each new lamp N1-Nm. Instead of matching each new lamp's OTLO to a test lamp curve, that single adjustment factor can be used for all new lamps to extrapolate STLO from OTLO. This method assumes all test lamps behave similarly. If not, reference to individual test lamp test data may be preferable.

The single adjustment factor could also be used to extrapolate from any measurement time for a new lamp to some other time (whether forward or backward). For example, if test lamp data covers from operating temperature time to 3000 hours, and all test lamps behave similarly, the adjustment factor could be used to predict performance of a new lamp at 3000 hours based on an OTLO measurement of the new lamp.

The other new lamps N2, N3, . . . , Nm would be normalized in a similar fashion. In this example, new lamp N2 has an OTLO value of 186,000 lm (see FIG. 5). This happens to correspond most closely with the test curve for test lamp T2 (having a 20 minute lumen output value of 184,000 lm) (see FIG. 4). Superposing or using the T2 curve, a lumen output value at 100 hours for new lamp N2 can be extrapolated (see N2@STLO in FIG. 6). This STLO value is 156,000 lm. FIGS. 4-6 illustrate similar normalization for the remaining new lamps N3 and Nm.

Other ways to "normalize" (a) a measurement (e.g. taken at first reaching operating temperature) with (b) a reference value correlated to a different operating time can, of course, be used. For example, 100 hour RILO can be extrapolated back to 20 minute operating time using a percent light loss characterization from a test set of lamps, assuming all lamps of this type behave similarly. Other ways are possible.

As can be appreciated, the number of new lamps (the value of variable m) can vary according to need or desire. The number depends on how many lamps a lighting system manufacturer/assembler needs on hand to fulfill customer orders in a reasonable or desirable time frame. This number could vary from less than one hundred to thousands of new lamps, depending on the lighting system company and its customer orders.

The translation, conversion, normalization, or extrapolation of OTLO to STLO allows a direct comparison of STLO and RILO because both are now correlated to the same cumulative operating time. They are normalized or correlated to ST (seasoning time or 100 hours). STLO is thus based on actual measurements of the test set of like-type lamps. It has been found that this extrapolation is within an acceptable margin of error.

A database of STLO for each new lamp N1-Nm can be created, correlated to the I.D. for each new lamp (step 120).

5. Compare STLO of Each New Lamp to RILO Value for that Type of Lamp

RILO as been previously described. In this example it is the manufacturer's published rated light output generalization for lumen output at 100 hour burn-in or seasoning time.

Method 100 then compares STLO value for each new lamp N1-Nm to RILO for that type of lamp (see FIG. 2, step 122). This can be done with a computer (e.g. spreadsheet). It could also be done by other methods, including by hand.

Figure 7:
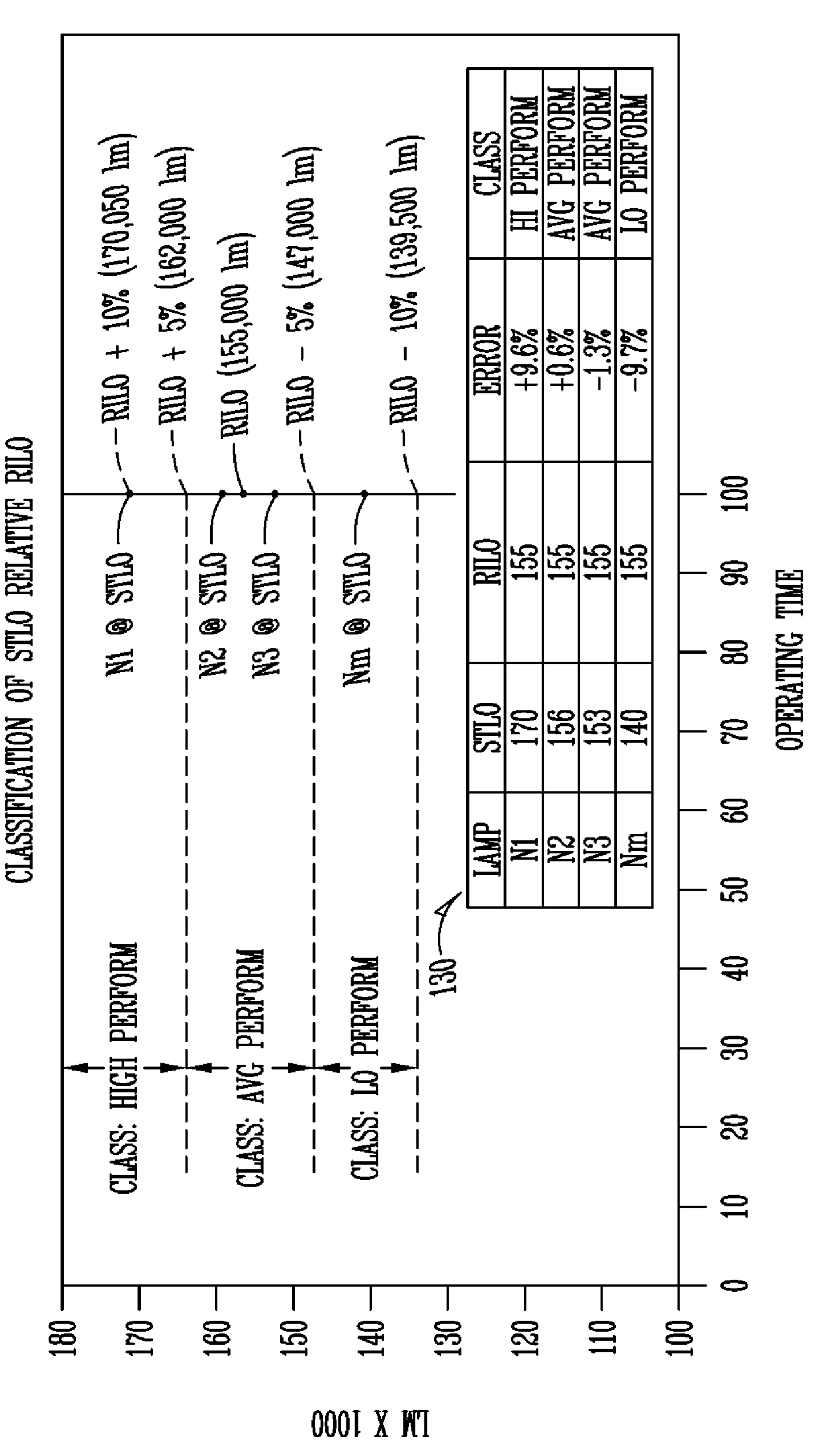
FIG. 7 is a chart comparing STLO values for each new lamp from FIG. 6 with RILO of FIG. 1 to calculate an offset or error between those values to classify each new lamp into a three class classification system according to an exemplary embodiment of the present invention.

FIG. 7 illustrates the general concept. The STLO value for each new lamp N1-Nm is plotted relative to the single RILO (or other reference value) value. Essentially, the comparison is:

$$STLO-RILO=error$$

where

STLO=extrapolated value of step 118

RILO=manufacturer's published nominal or rated initial lumen output of FIG. 1.

Error=remainder or offset expressed as a percentage of RILO, if any, between STLO and RILO, including whether a positive (exceeds) or negative (is less than) value.

The comparison provides a magnitude of difference, error, or offset between the extrapolated seasoning time lumen output of each individual lamp N1 to Nm relative to RILO value, the generalized rated initial lumen output (or other reference value) for the type of lamp selected (model and manufacturer).

6. Classify Each Lamp Based on the Comparison

After obtaining the actual light reading OTLO after the initial, relatively short operating period, extrapolation to STLO, and quantifying the magnitude of error between STLO and RILO, each new lamp N1-Nm is classified. STLO is a prediction, not an actual measurement of light output of the lamp in the future. But it is based on actual, substantially complete model of each of a reasonably statistically significant number of the same type of lamp, not on a sampling of a fraction of the lamps and generalized information about all lamps of that type.

The remainder or error from the comparison between STLO and RILO determines whether a lamp N is placed into one of three classes; high performing, average performing, or low performing (FIG. 2, steps 122-130). There could, of course, be additional classes.

a) Class One—Average Performer

Rule: If error, as a percentage of RILO, is within +/−5% of RILO, the lamp N would be considered an average performing lamp (a first classification) (steps 122, 124, and 126). This predicts that the particular lamp will produce about the expected or predicted lumen output of the lamp manufacturer over its entire rated life.

Specifically, if the comparison (step 122) results in a remainder that is +/−5% of RILO (step 124), in this embodiment the lamp N is considered an average performer (step 126). This range of error (+/−5%) is graphically illustrated in FIG. 7. The +/−5% range is considered to be reasonable in this example as it is based on a reasonably good mix of high, average, and low performing test lamps. A different range can be used. Or, that range can be sub-divided or added to. Or, additional ranges tied to additional classes can be used.

b) Class Two—High Performer

Rule—If error of STLO (or the light output reading after 20 minutes of keyed up (operating) time after extrapolation to seasoning time or 100 hours), as a percentage, is more than +5% over RILO, the new lamp N would be considered a high performing lamp (a second classification) (steps 122, 132, and 134). This predicts that the particular lamp will produce a higher lumen output over its operating life than might otherwise be expected or predicted by the manufacturer. This has been established by the test set, which indicates that a high OTLO measurement will result in relatively high lumen output readings over the rated life of the lamp.

Specifically, if the comparison (step 122) results in a remainder that is greater than +5% of RILO (step 132); in this embodiment the lamp N is considered a high performer (step 134). Essentially, this is considered to indicate that the particular lamp likely will produce more lumen output over its normal operating life than the average performer. This range of error (>+5%) is graphically illustrated in FIG. 7.

c) Class Three—Low Performer

Rule—If error is 5% under RILO, it is considered low performing (a third classification) (steps 122, 136, and 138). This predicts that the particular lamp will produce a lower lumen output over its operating life than might otherwise be expected or predicted by the manufacturer.

Specifically, if the comparison (step 122) results in a remainder that is less than −5% of RILO (step 136); in this embodiment the lamp N is considered a low performer (step 138). Essentially, this is considered to indicate that the particular lamp likely will produce less lumen output over its normal operating life than the average performer. This range of error (<−5%) is graphically illustrated in FIG. 7.

7. Record Classification for Each Lamp

Once method 100 classifies a lamp N, the classification is recorded or stored in a database, or otherwise, correlated to the I.D. of the particular lamp (step 130). See also conceptual illustration in FIG. 7.

A record of the classification can be established (e.g. in computer memory or otherwise). Each classified lamp can then be placed in inventory. The lighting designer, system manufacturer/assembler, and/or system installer can then have a ready inventory of lamps of different lumen output performance classifications to choose from.

Figure 8:
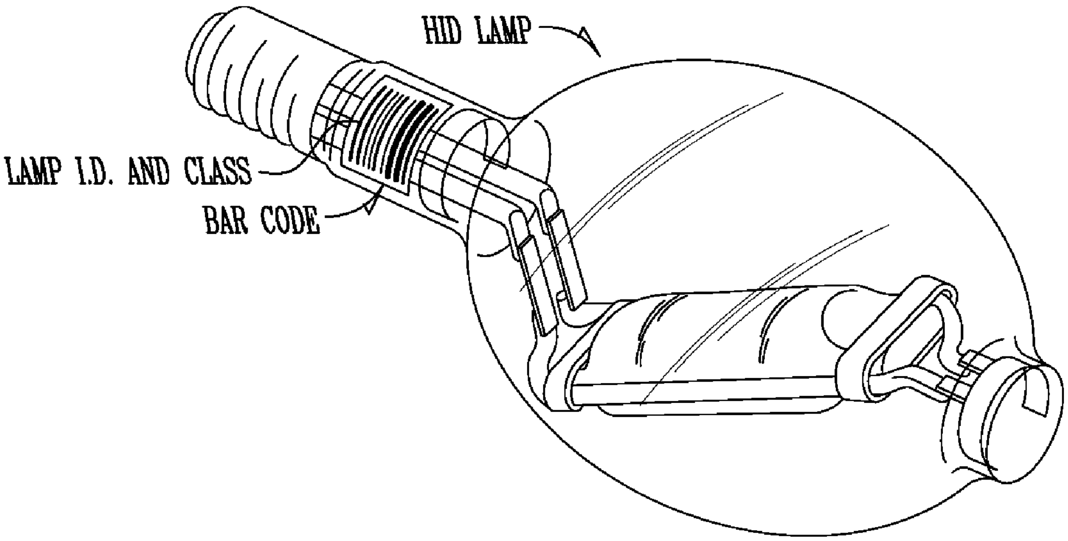
FIG. 8 is an illustration of a new lamp with a machine-readable label including a unique identifier or I.D. for the lamp and its classification according to FIG. 7.
Figure 9:
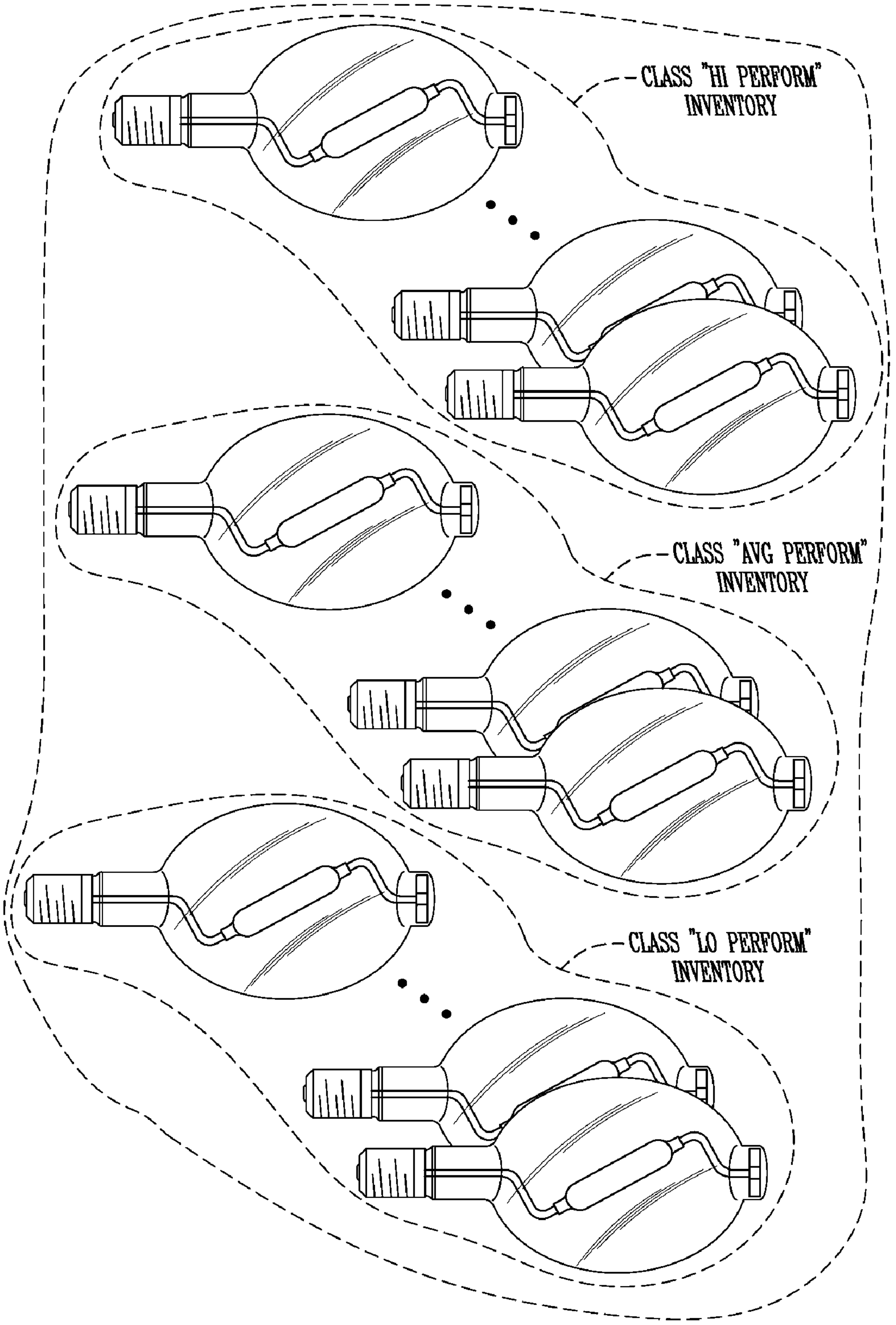
FIG. 9 is a diagrammatic illustration of an inventory of a plurality of lamps of FIG. 8, each classified into one of the three classes of FIG. 7 and available for use in an application.

Optionally, each lamp can be labeled with its identifier and its classification (e.g. printed label or bar code label or other machine-readable label) by known methods (see FIG. 8). The lamps effectively can then be identified by class in inventory of multiple lamps by simply reading the bar code. The lamps could be segregated in inventory by classification (see conceptual inventory of FIG. 9). A machine-readable label on each lamp (FIG. 8) would allow efficient identification of class of each to place them appropriately in segregated inventory locations and/or identify or corroborate the classification of each when needed.

8. Use of Classification

Once classified, the designer can select use of either high, average, or low performing lamps in the system depending on need or desire. A few examples of how different classes could be selected have been described earlier. Others are, of course, possible.

9. Summary of Exemplary Embodiment

Method 100 can therefore be used to (a) classify the lamps respective to their performance and (b) utilize such lamps for different applications based on such classification. Classifying the lamps allows for economy of scale and improved efficiency for the lighting design.

For example, applications that require higher amounts of light can utilize lamps classified as high performance, while applications with normal levels or lower levels of light can utilize lamps classified as average or low performance. Reducing the number of lighting fixtures can often save cost on the mounting structure due to the reduced weight and wind forces applied to the structure. Also, equally important, less lighting fixtures result in minimized energy cost for the customer.

It should be understood that the above is just one method of lamp classification, many others are possible. For example, more classifications could be created for finer increments of lumen output. As mentioned, alternatively lamps could be classified based on characteristics other than lumen output, such as color or lamp efficacy.

C. System of Lamp Classification

From a practical and functionality view, classifying lamps according to the present invention can be advantageously accomplished through automated testing of each lamp. This is due to the large quantity of testing required, and the accuracy required. However, manual testing could be performed.

There are many ways to configure an automated system for testing of such lamps. Automated systems are widely used in many different manufacturing applications and the design of such is familiar to those in the art.

A basic system of classifying lamps according to an exemplary embodiment of the invention is as follows. Each lamp's unique characteristic is measured. The lamp's lumen output, color properties, and/or energy consumption, etc. is measured via a conventional testing apparatus (it could be automated). The testing apparatus for making each such measurement are well-known to those skilled in the art. The lamp is then assigned what will be called a "classification" or a "Classification ID" based on the lamp's measured performance. The lamp's characteristics and Classification ID is recorded in a database. The lamp database is integrated with other information systems to aid in the application and selection of lamps by their classification.

Classification is an efficient method to group lamps with similar properties together for identification and warehousing. Classification can be letters, numbers, or any combination of such. The lamps can be classified in to as few as two groups. The preferred number of groups in this example is three, in this case high, low and average, based on performance measured.

Lamps are selected for use by the lighting designer during the design of the lighting project. The lighting design computer software is integrated with the lamp database to coordinate classified lamps to the appropriate application. During the manufacturing of the lighting equipment for a particular project, the lamp classification is used to ensure the desired lamp is installed into the lighting fixture for a given project. Known in the art, computerized lighting design software systems exist and allow the designer to enter an assumed light output of lamps. With the present invention, the assumed light output will be closer to actual light output and, thus, the designer can be and will be more precise because the invention allows the designer to better predict what amount of light output will be in each fixture in the system being designed.

For example, a system could be set up to move a set of lamps serially on a conveying system to a measuring station, where they are sequentially tested (e.g. lumen output measured automatically) and the results stored in a database correlated to each lamp. The conveying system can begin operation of each lamp at an appropriate estimated time before it arrives at the measurement station (e.g. 20 minutes ahead of time). In this way an indefinite and unlimited number of lamps can be serially processed. Alternatively, a fixed set of lamps could be simultaneously operated for a set time (e.g. 20 minutes) and then either simultaneously or almost simultaneously measured (e.g. for light output). A variety of possible designs are within the skill of those skilled in the art after the benefit of this disclosure.

For example, a semi-automated conveyor system could hold plural lamps, supply start up electrical power to each, run each for the 20 minute period, measure lumen output at the end of the 20 minute period, and record it (e.g. in computer memory correlated to its respective lamp identification). Such a system could do so serially or in parallel for multiple lamps.

D. Examples of Application of Classified Lamps

Thus, it is advantageous when designing the lighting system to use realistic lumen output values in the computer design software used to predict the lighting outcome. In addition, it may be advantageous to use lamps from a given classification or classifications to improve the lighting system or to reduce cost.

In addition, classifying lamps provides a method for increased quality assurance by using lamps with known lumen output.

The following will describe various applications for lamps of different classification. This is just a few applications, many more are possible.

a) High Performance Classification

The application of high performance classified lamps is generally reserved for projects with stricter light performance criteria or in situations where efficiency gains can be realized. The application will vary on a case by case basis. In general, if a predetermined light performance is guaranteed to the customer, then high performance lamps may be needed to ensure light criteria is achieved without extra fixtures. For example, if the predicted light output is close to the specification criteria, then high performance lamps may be used. For example, if the predicted light level at the target area is 50.1 foot-candles (fc) and the specified criteria is a minimum of 50 fc, then high performance lamps can be used to ensure adequate light is available without adding additional fixtures.

Another application of high performance lamps is to minimize the overall number of fixtures used. This may be for reasons of minimizing cost, structural loading on the mounting structure, minimizing electrical requirements, minimizing energy consumption, or other factors. In general, an increase in the lumen output of the lamp will allow a reduction in the overall number of fixtures. This is especially true for lighting designs with predicted light level with marginal extra light available. For example, if the predicted light level at the target is 52 fc for a design with specified criteria of 50 fc, then the margin of safety (or error) is 2 fc. Using high performance lamps in this design may increase the light level to close to 57 fc at the target area. Since only 50 fc is required, the excess fixtures could be eliminated to provide closer to the 50 fc level with less overall fixtures. For the customer, this will reduce the energy use, saving the customer money. It may also save the customer and manufacturer money relative the mounting structure and electrical requirements as the structural loading and electrical loading would be reduced as well as fixture capital costs.

In yet another application, the total number of fixtures may not be reduced but yet not increased. For situations where the predicted light level is slightly less than the minimum criteria, high performance lamps may provide the additional light needed without increases in the number of fixtures required. This provides similar customer, and manufacturer, savings as described above.

High performance lamps could also be used to increase or correct deficiency in light levels measured in the field. If the measured light level at the target area does not meet the minimum criteria, then the high performance lamps could replace low or average performance lamps to provide additional light the meet the specified criteria.

In another application, high performance classified lamps can be mixed with other lamp classifications to provide additional light in key areas on the target area. This can be an area that requires more light for a given task, such as the infield for baseball fields, key player positions such as the batter, or areas that inherently have less light due to the application of the fixtures. For example, the corners of soccer fields tend to be lower in light levels than the middle of the sideline. Extra light in the corners would be beneficial for corner kicks. However, it might not justify the cost of adding additional fixtures. Therefore, selective use of high performance lamps can boost the light in key areas without adding additional fixtures or energy cost.

b) Average Performance Classification

What will be called "average" performance classified lamps can be used on projects where the predicted light level using the nominal lamp lumen output provides the specified criteria with reasonable safety margin. A reasonable safety margin is 0.5 to 1 fc above the specified minimum criteria. Since the lamp lumen output of each lamp is measured and classified with the present method, meeting the specified criteria with the above safety margin is achievable. For example, if the predicted light output using average classified lamps is 50.5 fc for a 50 fc criteria, then average classified lamps could be selected. High classified lamp could be used to provide more light, but perhaps not enough additional light to allow for reducing the overall number of fixtures required. Therefore, since efficiency gains are not realized with the high classified lamps, the average classified lamps are best suited for this application. This can be especially true for projects with relatively few overall fixtures to start with. For example, a lighting design using 20 fixtures may not benefit from a 5%-7% increase in light output compared to a design with 100 fixtures. The lighting design with 100 fixtures will likely be able to reduce the overall quantity of fixtures needed by five to seven fixtures by utilizing high classified lamps while the 20 fixture design would only be able to reduce fixture count by 1 fixture. Since the quantity of fixtures on the multiple mounting structures for lighting areas, particularly sports fields, tend to be equally distributed, reducing just one fixture can be unpractical.

Average lamps could be selectively applied in a design with mostly what will be called "high" classified lamps to reduce the amount of light in a given area. An excess of light in an area is sometimes referred to as a "hot spot" due to the visible difference in light for that given area.

c) Low Performance Classification

What will be called "low" classified lamps may be applied for lighting designs with low light requirements. One example is large area lighting, such as parking lights. These types of areas generally require very low light levels, such as 1-5 fc. Since the need of the lighting design is to provide general dispersion of light over a large area, average or high classified lamps are not required nor do they have much benefit over the low classified lamps. This is especially true when the fixture count per mounting structure location is just a few, such as 1-3 fixture(s) per location. Typically the desired amount of light is achieved using the low classified lamps without adding additional fixtures. Thus the energy consumption is the same as with average or high classified lamps.

Low classified lamps may also be used for small area lighting where the amount of light available is considerably greater than the specified criteria, but not so great that a lower wattage lamp could be used. For example, tennis courts can be lighted with as few as 4 fixtures. If lower wattage lamps than 1500 watt are used, such as 1000 watt or 400 watt, then more than 4 fixtures might be required. Thus, use of low classified lamps reduces the excess light while maintaining the same quantity of fixtures and same energy consumption.

E. Options and Alternatives

As can be appreciated by those of skill in the art, the present invention can take many forms and embodiments. The exemplary embodiments described herein are neither exclusive nor inclusive of all the forms and embodiments the invention can take, which is described solely by the claims herein.

1. Variations in Method Steps and System

For example, variations obvious to those skilled in the art will be included within the invention. Some of those possible variations have been mentioned in the preceding description. Others are, of course, possible.

Variations obvious to those skilled in the art in the system that could be utilized to practice the methods are also included within the invention. Some have been mentioned in the preceding description. Others are possible. One example is as follows. The term "lamp" has been used. Sometimes the term is used to apply to a device that has a base and a source of light output enclosed by an envelope. Herein it is intended to mean any radiant light source whether or not including associated structure or components such as electrical connections, envelope, and the like.

2. Alternative Uses of Lamp Classification Method

Applications and uses for the methods and systems according to the invention can also take different forms and embodiments.

For example, the process of testing lamps to classify them by performance is also useful for a general quality control measure. Lamps that do not pass the minimum requirements can be identified. This allows for close inspection of such lamps and determination of disposition.

Another use of the lamp classification apparatus is to provide a closed loop on the lamp performance. By initially classifying lamps and recording the individual lamps characteristic in a database, the same lamp can be tested in the future using the same process. This would be useful to verify that the actual light output of the lamp for the given operated hours equals the projected light output expected based on the initial classification and known lumen depreciation rates. This helps validity of any guarantee of lighting performance throughout the lamps life. It closes the loop of testing the lamp performance early in its life and again at the end of its life to ensure that the predicted lumen depreciation rates are applicable.

3. Lamp Data Tracking

Due to periodical and scheduled maintenance on the lighting system, the characteristics of the lamp used in a fixture for each project normally would be recorded. This information can be used to ensure the same lamp classification is used for any replacement lamps installed in the fixture.

4. Lamp Manufacturer Classification

A lamp manufacturer could use the invention to classify its lamps. This could allow the manufacturer to either keep this information internally for quality control or other purposes. Alternatively, the lamp manufacturer might use the information to offer lamps of different classification. For example, it might sell high performer classified lamps, including at a premium price, to customers that desired them. Conversely, low performer classified might be sold to customers desiring them at a discounted or lower price than average or high performer classified lamps.

5. Color

Color temperature (or other color characteristics) can, similar to light output, be measured at a relatively early lamp operating time (e.g. between achieving operating temperature and burn-in or seasoning time) for each new lamp N1-Nm. The actual color measurement can be normalized or extrapolated to the same operating time frame as a reference value (e.g. a rated generalized value from the lamp manufacturer) for the same color characteristic, using test set test data. A comparison between extrapolated and reference values can be used to classify each new lamp relative to this color characteristic. The designer can then select a desirable color classification or classifications for a given application.

6. Lamp Efficacy

Similarly, using known methods, lumens/watt can be measured at a relatively early time of operating of each new lamp N1-Nm, extrapolated to a reference time using test set data, and compared with a reference value (e.g. a manufacturer's rated, generalized value) to classify individual lamps based on lamp efficacy. The designer could select lamps based on this classification.

It is, of course, possible to classify a new lamp N relative to more than one characteristic. For example, a new lamp N could be classified as high, average, or low performing for light output and/or lamp efficacy and/or color temperature (and/or others). Also, several classifications of different lamp characteristics could be combined into a single classification for a lamp.

What is claimed is:

1. A method to predict performance of an HID light source comprising:

a. operating an HID light source at a set of operating parameters until the light source is at or near a normal operating temperature;

b. measuring light output from the light source when at or near the normal operating temperature;

c. comparing the measured light output to a reference light output; and d. classifying the light source based on the comparison.

2. The method of claim 1 wherein the HID light source is at or above 400 watts rated operating power.

3. The method of claim 1 further comprising measuring, at or near the time when the light output is measured, one or more of:

a. color; or b. power usage.

4. The method of claim 1 wherein step a. comprises operating the HID light source for less than four hours.

5. The method of claim 4 wherein step a. comprises operating the HID light source for less than 30 minutes.

6. The method of claim 1 further comprising measuring other electrical properties of the light source.

7. The method of claim 1 wherein the reference light output is based upon empirical testing of a number of same or similar light sources or manufacturer's information.

8. The method of claim 1 wherein the comparison comprising identifying any error between the measured light output and the reference light output, and the step of classifying comprises:

a. assigning the light source to a high performing class if the error is above a threshold;

b. assigning the light source to a low performing class if the error is below a threshold.

9. The method of claim 8 wherein the step of classifying further comprises:

a. high performing if above a first threshold;

b. low performing if below a second threshold; and c. assigning the light source an intermediate or average performing class if the error is within a margin of error to the reference light output.

10. The method of claim 1 further comprising providing a unique identifier to each light source and storing or recording the classification for the HID light source correlated to its unique identifier.

11. The method of claim 10 further comprising using the classification to assign an application or use for the HID light source.

12. The method of claim 10 wherein the HID light source comprises a plurality of light sources.

13. The method of claim 1 wherein the method of claim 1 is used to test each light source of a plurality of light sources of a lighting system.

14. The method of claim 13 further comprising:

a. assigning all high performing classified light sources to a lighting system, wherein a high performing classification comprises measured light output greater than nominal initial light source lumen output for the light source; or b. assigning all low performing classified light sources to a lighting system, wherein a low performing classification comprises measured output of less than nominal published light source lumen output for the light source; or c. assigning a mixture of higher and lower performing classified light sources to a lighting system.

15. The method of claim 13 wherein the lighting system is a sports lighting system for lighting a sports field to a predetermined light uniformity and intensity specification.

16. The method of claim 1 wherein the reference light output comprises nominal or rated initial light output:

a. published by a manufacturer for the light source; or b. derived by field or laboratory testing of test light sources.

17. The method of claim 1 wherein the step of operating begins at or nearly at initial operation of the light source.

18. The method of claim 1 wherein initial operation is nearly first application of voltage or wattage to the light source.

19. The method of claim 16 wherein:

a. a high performing classification comprises measured light output greater than 5% of nominal initial light source lumen output for the light source; and b. the low performing classification comprises measured output of less than 5% of nominal published light source lumen output for the light source.

20. The method of claim 19 further comprising an average performing classification which comprises +/−5% of nominal initial light source lumen output for the light source.

21. A method of classifying HID light sources comprising:

a. operating each light source for a relatively short period of time related to reaching normal operating temperature after start up;

b. measuring light output at the end of the relatively short period of time; and c. classifying each light source based on differences of the measured light outputs.

22. The method of claim 21 wherein there are two classifications.

23. The method of claim 21 wherein there are more than two classifications.

24. The method of claim 21 wherein classifying is based on a comparison of measured light output to rated initial lumen output for the light source.

25. The method of claim 24 wherein a first classification is given a light source with measured light output of greater than 5% of rated initial lumen output and a second classification is given a light source with measured light output of less than 5% of rated initial lumen output.

26. A method of choosing an HID light source for a lighting fixture comprising:

a. operating the HID light source for an initial relatively short period of time;

b. measuring light output of the HID light source at the end of the initial relatively short period of time;

c. classifying the light source by comparing measured light output with predicted light output of the light source;

d. selecting an HID light source based on its classification;

so that selection is based on the predicted light output for an individual light source based at least in part on an actual measurement of the light output of the light source.

27. The method of claim 26 applied to a plurality of light sources and wherein the selecting is based upon designing a lighting system to meet light uniformity and intensity specifications for the system.

28. The method of claim 27 further comprising minimizing a number of fixtures for the lighting system design based on the selecting step.

29. The method of claim 26 wherein the classification is based on difference in measured light output relative to a reference light output.

30. The method of claim 29 wherein the reference light output is rated initial light output at burn-in or seasoning period of time for the light source and the relatively short period of time is less than the burn-in or seasoning period of time.

31. The method of claim 30 wherein a first class is +5% above rated initial light output for the light source, a second class is within +/−rated initial light output, and a third class is below −5% of rated initial light output.

32. The method of claim 31 wherein the first and third classes correlate generally to +/−5% more or less light from the HID light source and the second class is within +/−5%.

33. The method of claim 26 wherein the measurement is based on actual light output at a time the light source first reaches normal operating temperature.

34. A method of designing wide-area HID lighting systems, each having a plurality of light fixtures with HID light sources, to meet specifications of light uniformity and intensity for a target area of the system comprising:

a. selecting a type of HID light source of rated operating wattage and rated initial light output for use in the light fixtures;

b. deriving light output performance data for the type of selected HID light sources from a test set of light sources of the same type;

c. pre-testing a set of new light sources of the selected type to predict individual light output performance for each by:

i. operating each new light source for a relatively short period of time;

ii. measuring light output at the end of the relatively short period of time;

iii. classifying each light source based on evaluating of the measurement relative to the performance data of the test set, the classification predicting whether each light source will produce, at rated operating power over substantial normal operating life of the light source:

1. above rated light output; or 2. below rated light output;

d. designing a number of fixtures and light sources for the fixtures for the lighting system by using the classifications of the light sources.

35. The method of claim 34 wherein the designing comprises:

a. using light sources classified to produce below rated light output;

b. using light sources classified to produce above rated light output; or c. using a mixture of light sources classified to produce below and above rated light output.

36. The method of claim 34 further comprising measuring lumen output of the light source at one or more discrete times during operating life and comparing with the classification to determine validation of the classification relative to the light source.

37. A method of classifying light sources comprising:

a. measuring a characteristic of each of a plurality of new light sources relatively early in operating life, where relatively early is before seasoning or burn-in time for a type of light source;

b. comparing the measured characteristic to a rated value of the characteristic for the type of light source;

c. classifying each new light source based on the comparison.

38. The method of claim 37 wherein the classifying is into a plurality of classes correlated to lamp performance relative to the lamp characteristic.

39. The method of claim 38 further comprising assigning a value to a higher classification.

40. The method of claim 39 wherein the value comprises a premium price to a customer.

41. The method of claim 37 wherein the characteristic is light output.

42. The method of claim 37 wherein the characteristic is related to color of the light output.

43. The method of claim 37 wherein the characteristic is related to lamp efficacy.

44. The method of claim 37 wherein relatively early comprises at least at or near reaching operating temperature.

* * * * *